(12) United States Patent
Coutts et al.

(10) Patent No.: US 6,377,837 B1
(45) Date of Patent: Apr. 23, 2002

(54) NUCLEAR MAGNETIC RESONANCE IMAGING APPARATUS

(75) Inventors: Glyn A. Coutts, Hanwell (GB); Larry Kasuboski, Solon, OH (US)

(73) Assignee: Picker International, Inc., Cleveland, OH (US)

( * ) Notice: Subject to any disclaimer, the term of this patent is extended or adjusted under 35 U.S.C. 154(b) by 0 days.

(21) Appl. No.: 08/975,695

(22) Filed: Nov. 21, 1997

(30) Foreign Application Priority Data

Nov. 23, 1996 (GB) .............................. 9624399

(51) Int. Cl.[7] ................................ A61B 5/055
(52) U.S. Cl. ....................... 600/423; 600/424
(58) Field of Search ................. 600/410, 414, 600/421, 423, 424; 324/307, 309; 424/9.3

(56) References Cited

U.S. PATENT DOCUMENTS

| | | | |
|---|---|---|---|
| 5,271,400 A | * 12/1993 | Dumoulin et al. | |
| 5,318,025 A | 6/1994 | Dumoulin et al. | ........... 600/410 |
| 5,365,927 A | 11/1994 | Roemer et al. | |
| 5,517,990 A | 5/1996 | Kalfas et al. | |
| 5,938,599 A | * 8/1999 | Rasche et al. | ............... 600/410 |
| 5,964,705 A | * 10/1999 | Truwit et al. | ................ 600/423 |
| 6,216,026 B1 | * 4/2001 | Kuhn et al. | .................. 600/409 |
| 6,236,205 B1 | * 5/2001 | Ludeke et al. | ............... 324/318 |
| 6,242,915 B1 | * 6/2001 | Hurd | ........................... 324/309 |

OTHER PUBLICATIONS

M. Burl, et al.; "Tuned Fiducial Markers to Identify Body Locations with Minimal Perturbation of Tissue Magentization" Magnetic Resonance in Medicine, vol. 36, No. 3, Sep. 1996, pp. 491–493.

D.J. Gilderdale, et al.; "Design and Development of a Device for MRI Guided Transrectal Biopsy of the Prostate"; ISMRM, New York, New York, Apr. 1996; vol. 3; p. 1439.

G.A. Coutts, et al.; "Integrated Position Tracking and Imaging of Interventional Tools and Internal Devices Using Small Fiducial Receiver Coils"; ISMRM; Vancouver, B.C., Canada; Apr. 1997, vol. 3, p. 1924.

N.M. deSouza, et al.; "A Solid Re–Usable Endorectal Receiver Coil for Magnetic Resonance Imaging of the Prostate: design, use and comparison with an inflatable endorectal coil"; SMR and ESMRMB, Nice, France, Aug. 1995; vol. 1, p. 187.

M. Burl, et al.; "Small Tuned Fiducial Markers Designed to give Substantial MR Signals with Minimal Perturbation of Body Magnetization"; SMR and ESMRMB, Nice, France, Aug. 1995; vol. 1, p. 188.

C.L. Dumoulin, et al.; "Real–Time Position Monitoring of Invasive Devices Using Magnetic Resonance"; MRM 29:411–415 (1993).

* cited by examiner

Primary Examiner—Marvin M. Lateef
Assistant Examiner—Shawna J. Shaw
(74) Attorney, Agent, or Firm—John J. Fry

(57) ABSTRACT

A medical instrument, for use in relation to an MR scanner, comprising body portion having mounted thereon a plurality of positioning elements each of which comprises a reservoir containing a liquid and at least two spaced tuned MR auxiliary receiver coils positioned coaxially with respect to one another and carried by the reservoir, and means for electrically connecting the said auxiliary coils to separate receiver channels of the MR scanner. Flux enhancement is used to enable the positioning elements to be rapidly located without disturbing the magnetization of the patient and thereby permit the position of the medical instrument and the image of the patient to be rapidly cycled between.

19 Claims, 2 Drawing Sheets

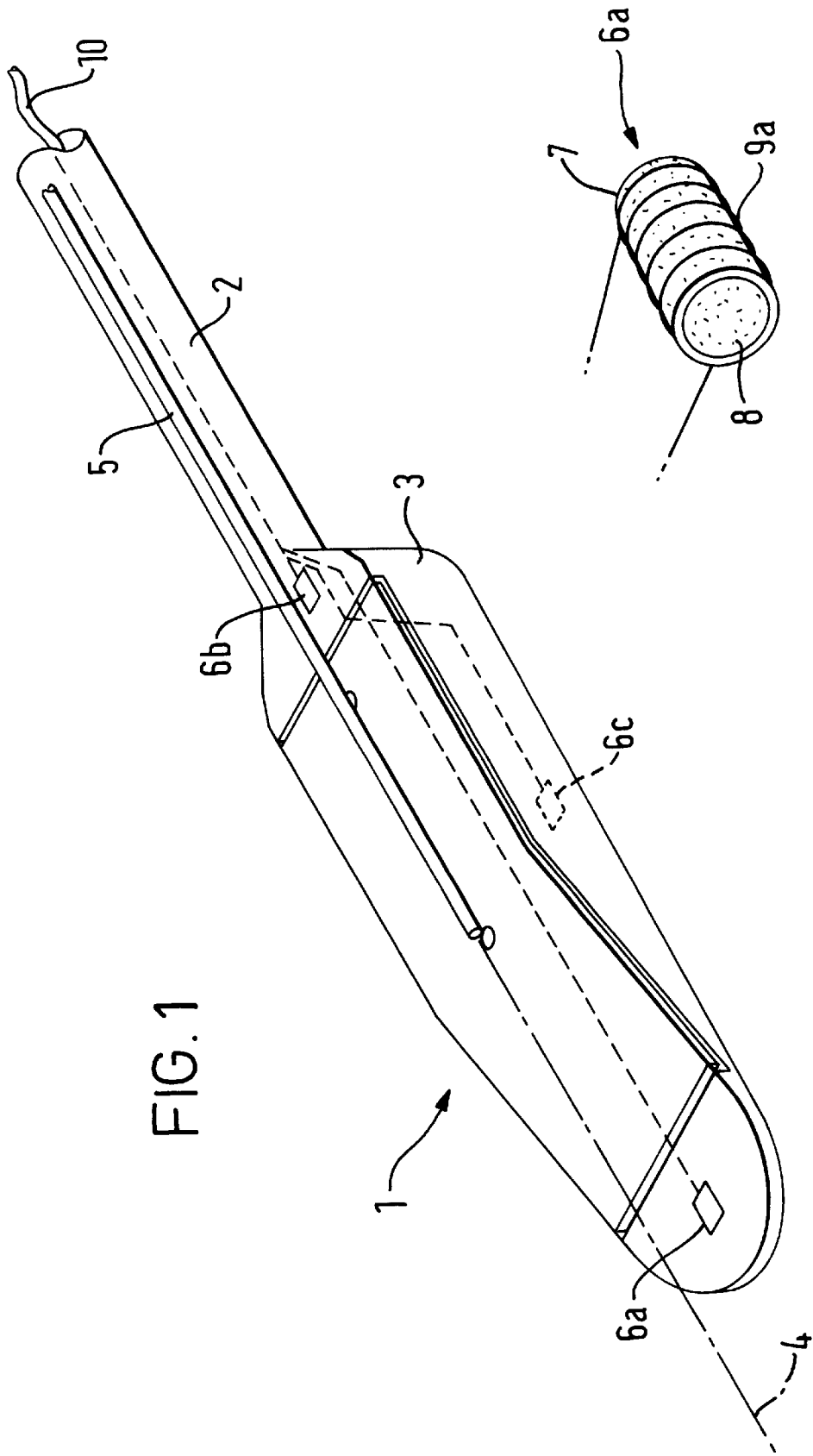

NUCLEAR MAGNETIC RESONANCE IMAGING APPARATUS

BACKGROUND OF THE INVENTION

The present invention relates to a device for use with Nuclear Magnetic Resonance Imaging Apparatus (known as MRI). Such a device would be for carrying out an interventional activity such as a biopsy.

Whilst MRI is used to simply visualise the internal structure of the human body in order to aid the diagnosis of the patient's condition it is also possible to carry out interventional activities such as a biopsy in those situations where the relevant part of the patient's body is accessible. This could be where a so-called open MRI system is being used, e.g. one using two spaced apart coils or a C-shaped magnet or one in which the axial length of the field magnet, and thus its bore into which the patient fits, is sufficiently short to allow such access. Such systems are hereinafter referred to as "accessible" systems.

The combination of such accessible magnet systems, along with the commercial availability of MR-compatible biopsy needles, has opened up the possibility of exploiting the excellent soft tissue contrast of MR imaging to visualise lesions in order to guide biopsies.

In order to accurately position the biopsy needle a so-called stereotaxy device is employed, this device enabling points in space within the patient to be accurately defined. For example a frame stereotaxy device comprises a physical three-dimensional framework which is clamped to the patient, e.g. to the patient's head, so that any point in space within the patient's head can be accurately defined on the x, y and z axes in relation to the framework. A frameless stereotaxy device achieves the same effect but instead of using a physical framework to define the x, y and z coordinates it employs optical or ultrasound means.

One known approach is to place small MR-visible markers on the anatomy surface and collect a volume image of the region. The patient is then withdrawn from the bore of the magnet. A hand-held biopsy needle device with two ultrasound emitters set at fixed distances from the biopsy needle tip can be located in space by a fixed array of microphones and by pointing at the fiducial markers, the MR image information can be mapped onto the current position of the patient and hence the position and orientation of the biopsy needle can be displayed on the MR images.

In an accessible magnet system the operator can manipulate a biopsy needle device actually at the imaging region. By using an optical frameless stereotaxy system, for example, suitably mounted on the machine it is then possible for the current position of the device to set the MR imaging slice position in a dynamic way and hence guide the biopsy process.

In U.S. Pat. No. 5,365,927, it has been proposed to provide a pointing device to indicate the position and orientation of a plane in which an image is to be acquired. MR tracking devices, such as those disclosed in U.S. Pat. No. 5,271,400 may be used to track the position of the pointer.

SUMMARY OF THE INVENTION

The present invention is concerned with providing a device for use with an MR stereotaxy system, the latter to be used at the imaging region of an MR scanner such that the device can be guided in a very simple and interactive way using the magnet gradient system as the measurement system without the need for additional hardware. The particular application envisaged here is breast biopsy although the same device could be used by biopsy in other regions, for instance the liver or brain. The invention can also be used in connection with interventionalist devices other than biopsy devices, such as imaging coils adapted for insertion into body passages such as endorectal imaging coils.

The present invention provides a method of displaying the position and orientation of a medical implement in relation to a patient, the medical implement being provided with at least two positioning elements each comprising MR active samples with respective r.f. receiver coils carried by the samples, the receiver coils being connected to separate receiver channels of magnetic resonance processing electronics, which method comprises performing a cycle comprising the steps of applying an r.f. excitation pulse and magnetic field gradients, processing the magnetic resonance signals to locate the positions of the elements, applying r.f. excitation pulse and magnetic field gradients to image a region of the patient dependent on the location of a desired part of the medical instrument, and displaying the region of the patient with the instantaneous position of the medical instrument superimposed on an MR image, moving the medical implement and repeating the cycle.

The present invention also provides an apparatus for displaying the position and orientation of a medical implement in relation to a patient, the medical implement being provided with at least two positioning elements comprising MR active samples with respective r.f. receiver coils carried by the samples, the receiver coils being connected to separate receiver channels of magnetic resonance processing electronics, which comprises r.f. excitation pulse and magnetic field gradient means for exciting and detecting resonance, means for processing the magnetic resonance signals to locate the positions of the elements and to image a region of the patient dependent on the location of a desired part of the medical instrument, and display means for displaying the region of the patient with the instantaneous position of the medical instrument superimposed on it.

According to one aspect of the invention there are three positioning elements so located in relation to the body portion and to one another that when energised they generate signals which enables the position and orientation of the device to be determined and/or visualised with respect to the x, y and z axes.

According to a second aspect of the invention the liquid is doped water.

According to a third aspect of the invention each positioning element also includes a capacitor electrically connected to the auxiliary coils.

According to a fourth aspect of the present invention the body portion is made from a plastic material.

According to a fifth aspect of the present invention each reservoir comprises a glass phial.

BRIEF DESCRIPTION OF THE DRAWINGS

How the invention may be carried out will now be described, by way of example only, with reference to the accompanying drawings in which:

FIG. 1 is a diagrammatic perspective view of one embodiment of the invention;

FIG. 2 is an enlarged fragmentary view of part of FIG. 1; and

DETAILED DESCRIPTION OF THE INVENTION

Figure 3:
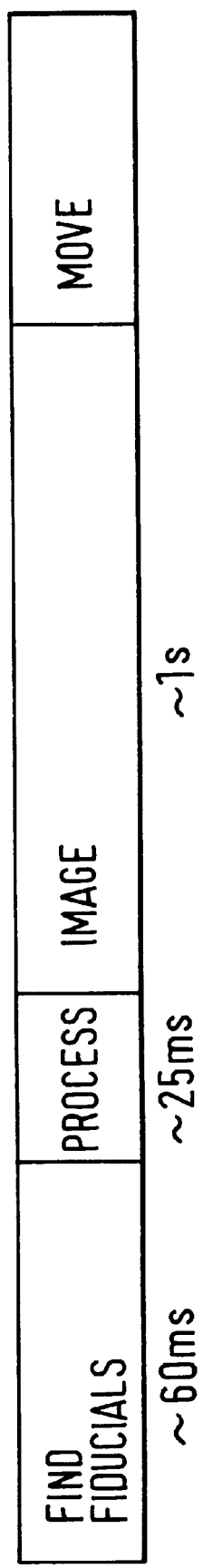
FIG. 3 is a schematic diagram of a timing sequence.

A biopsy needle device consists basically of a hand-held wand 1 made from a plastic material such as an acetal homopolymer DELRIN (Registered Trade Mark) which is adapted to carry a biopsy needle indicated at 4.

The plastic wand 1 has an integral handle 2 and body portion 3 the biopsy needle 4 being disconnectably mounted to it by means of a biopsy needle guide 5 in known manner.

The known biopsy needle device 1, 2, 3 is provided with a plurality (in this case three) positioning elements 6a, 6b and 6c each of which is located in a recess in the body portion 3 so that it is flush with the outside surface of the body portion.

An enlarged view of one of these positioning elements, 6a, is illustrated in FIG. 2 and this will now be described in more detail.

A substantially cylindrical glass phial 7, approximately four millimeters long, contains doped water 8 which will be visible on the display screen of the MRI apparatus. An auxiliary coil 9a is wound round the glass phial and electrically connected, via a capacitor (not shown) carried on or mounted close to the phial 7, to the MR energisation and control system.

The three elements 6a, 6b and 6c, which have coils 9a, 9b and 9c respectively, are positioned so that when energised they will enable the device 1 to be located in the desired position in relation to the x, y and z axis. Because ideally the positions of the elements 6a, 6b and 6c should be defined by points, these elements are made as small as possible consistent with them generating a strong enough signal in relation to the signal strength of the surrounding matter to ensure that the position of the three elements are clearly visualised on the systems display screen.

The water 8 is doped to give it a relaxation time, $T_1$ of 30 msec or less because the relaxation time of ordinary water is too long. The relaxation time is the time it takes for the water molecules to return to their original orientation after they have been flipped by the RF field from their neutral position along the z axis into the x, y plane.

Each of the coils 9a, 9b, 9c is connected through a lead 10, consisting of thin coaxial cables, to a preamplifier (not shown) and then to separate receiver channels of the MR scanner (not shown).

The way in which the biopsy device is used will now be described.

The device, and in particular the biopsy needle 4, is held in the imaging region of the field magnet of the MRI apparatus. A simple MR sequence consisting of four gradient-recall echoes is processed separately for each of coils 9a, 9b, and 9c, to thus determine the position of the respective water sample 8 within the respective phials 7 and relative to the magnet gradient system.

The procedure used corrects for magnetic field $B_0$ inhomogeneities. Non-linearities of the gradients system can be accounted for in the signal processing. No more than moderate scanner specifications are required to obtain suitable spatial resolution.

The signal in each receiver channel is predominantly from the doped water sample 8 contained within the respective phial 7. By this arrangement the position of each of the auxiliary coils 9a, 9b and 9c can be obtained within a time of 100 msec with a positional accuracy which is determined by the size of the water sample.

From the positions of the auxiliary coils 9a, 9b, 9c it is possible to calculate the location and alignment of the tip of the biopsy needle 4 relative to the magnet gradient system. This would be done using known software routines.

To perform a breast biopsy, for instance, the patient can be positioned in the decubitus position with the breast immobilised on a suitable surface receiver coil installed in a third channel of the MR scanner.

An initial contrast-enhanced $T_1$ weighted scan provides visualisation of the lesion, and hence the target position can be passed to the scanner software. The scanner is then run in a continual loop mode in which a pre-scan processes the data from the first and second channels to locate the needle 4 followed by a single-scan fast $T_1$-weighted gradient echo image via the third channel with position and orientation determined by the current needle position. The operator adjusts the needle position and the loop repeats.

An array of targeting strategies can be envisaged, all implemented through simple software routines. One possible strategy would be to set the slice orientation axially to the needle direction, centred along the line of the needle direction and passing through the target position. An MR system with a gradient performance of 10 $mT.m^{-1}$ amplitude and 10 $mT.m^{-1}.ms^{-1}$ slew rate can acquire such a single-slice scan in a few seconds.

To ensure that the wand device is held still throughout the pre-scan and imaging scan a mechanical holder could be used.

The current image is updated to the scanner display console and relayed via filtered lines to an LCD display mounted in a rf-shielded box at a convenient position to be viewed by the operator. The process continues from initial alignment of the needle direction at the surface of the breast to location of the needle tip within the lesion all being visible on the MR images.

Referring to FIG. 3, it is desired to interchange between the location of the positioning elements and the imaging of the patient as rapidly as possible. The same body coil is used for excitation in each case. A conflict therefore arises since it is necessary to minimise rotation of the bulk magnetisation of the scan region, during the excitation of the positioning elements (or fiducials), so as not to compromise imaging options. This requirement necessarily reduces the SNR achievable by the fiducial coils. This problem is solved by arranging for the fiducial coils 9a to be tuned, resonant coils, resonant at the frequency of the r.f. excitation. The fiducial coils then act as local flux amplifiers. This means that when the body coil produces an r.f. excitation pulse of 1°, while the body magnetisation is only subject to a 1° rotation, the fiducial samples experience a rotation several times this figure, with a corresponding increase in the SNR.

Because the bulk magnetisation is not significantly disturbed in finding the fiducials, then there is no need to allow a significant time for the body magnetisation to recover (for a large flip angle this could be as long as one quarter of a second). The two blocks of imaging the fiducials and imaging the patient can therefore be interchanged rapidly, which is a significant consideration if it is desired to make constant changes to the position of the medical instrument.

In essence, the sequence consists of two blocks which are continuously repeated. The first block is a position tracking data acquisition consisting of four gradient recalled echos with the gradient profiles applied on all three axes but with four different combinations of polarity. Such a method is described in U.S. Pat. No. 5,271,400. For each echo, 250 samples are collected with the field of view set to 40 cm to cover the imaging volume of the scanner. The entire position tracking data acquisition is completed in 60 msec.

Before the second imaging block begins, the positioning calculation is performed. It will be remembered that there are three fiducial coils 9a each connected to a separate channel of the processing electronics and a fourth channel of the processing electronics is connected to the main receive coil used for imaging the patient. The data on the imaging coil is discarded after the position tracking sequence, and the remaining three channels connected to the fiducial coils are processed separately, consisting of a Hadamard transform of the position of the maximum signal in the Fourier Transform from each echo. The effects of $B_0$ inhomogeneity are eliminated in this method, giving the position of each fiducial relative to the centre of the scanner gradient system to an accuracy determined by the size of the fiducial samples, the resolution of the data acquisition and the linearity of the gradient system. A straightforward calculation turns the current fiducial positions into a set of obliquer coefficients to be applied to the imaging gradient profiles, as well as slice positioning information.

The second block is the image data acquisition. 20 msec is allowed to load the new image orientation parameters calculated above. In the application here, a single slice 128×128 turboFLASH data acquisition is used, with a possible addition of a magnetisation preparation inversion pulse, with a total acquisition time of around 1 sec. The image is reconstructed and displayed directly at the scanner workstation. This display is relayed via 75 ohms filtered lines to an LCD positioned at the magnet face. A suitable delay allows the operator to review the current image and reposition the device before the cycle repeats.

To allow the capability of searching from the current probe position, the default slice position, determined by the probe position, can be offset and rotated from the workstation console. For example in a biopsy application one might chose to rotate the scan plane to be axial to the needle and then increment the scan plane forward from the current needle tip position until the target anatomy can be identified.

The invention is applicable to biopsy devices such as for imaging the prostate, or for imaging coils for insertion in a body passage for example an endorectal imaging coil. The MR active sample may be a liquid or a polymer dermal pad material (Spenco Healthcare International Limited, UK) placed within an eight turn solonoidal coil having approximately 1.9 mm internal diameter with 3 mm length, using 0.25 mm outside diameter silver wire. The assembly was mounted on a 4×10 mm PCB being tuned to 21.34 Mhz and shunt matched to 50 ohms for low loss signal transmission.

What is claimed is:

1. A method of displaying the position and orientation of a medical implement in relation to a patient, which method comprises:

performing a cycle which includes the steps of applying an r.f. excitation pulse and magnetic field gradients to at least two positioning elements disposed in known relation to the medical implement, each positioning element including an MR active sample and an r.f. receiver coil carried by the sample, the receiver coils being connected to separate receiver channels of magnetic resonance processing electronics; and processing the magnetic resonance signals to locate the positions of the elements and hence the medical implement.

2. A method as claimed in claim 1, in which the receive coils are tuned to the r.f. excitation frequency.

3. The method of claim 2 further comprising the step of applying an r.f. excitation and magnetic field gradient to image a region of the patient depending on the location of the elements.

4. The method of claim 3 further comprising the step of generating an image indicative of a position of the implement in relation to the anatomy of the patient.

5. A method as claimed in claim 1, in which the same transmit coil is used for locating the positioning elements as for imaging the region of the patient, and the r.f. excitation pulses for locating the positioning elements impart a total flip angle of less than 15°.

6. A method as claimed in claim 5, in which a plurality of pulses are applied for locating the positions of the positioning elements, and each pulse imparts a flip angle of 2° or less.

7. A method as claimed in claim 6, in which each pulse imparts a flip angle of 1° or less.

8. A method as claimed in claim 6, in which four pulses are used to position the positioning elements.

9. A method as claimed in claim 8, in which four gradient echos are processed for each of the r.f. receiver coils of the positioning elements.

10. An apparatus comprising:

a medical implement including at least two positioning elements, each positioning element including an MR active sample and an r.f. receiver coil carried by the sample for receiving a magnetic resonance signal therefrom;

magnetic resonance processing electronics, which includes r.f. excitation pulse and magnetic field gradient means for exciting and detecting resonance and a plurality of receiver channels, the receiver coils being connected to separate receiver channels;

a processor operatively connected to the processing electronics for processing the magnetic resonance signals to locate the positions of the elements and hence the medical implement.

11. Apparatus as claimed in claim 10, in which the receiver coils are tuned to the r.f. excitation frequency.

12. Apparatus as claimed in claim 11, in which each positioning element also includes a capacitor electrically connected to the auxiliary coils.

13. Apparatus as claimed in claim 11, in which the implement has an elongate body portion made from a plastic material.

14. The apparatus of claim 11 further comprising means for processing the magnetic resonance signals to locate the position of the elements and for imaging a region of the patient depending on the location of the elements.

15. Apparatus as claimed in claim 12, in which the MR active sample is a liquid contained in a reservoir.

16. Apparatus as claimed in claim 15, in which the liquid is doped water.

17. Apparatus as claimed in claim 10, including means for restricting a flip angle imparted by the r.f. excitation pulses for locating the positioning elements to a total of less than 15°.

18. Apparatus as claimed in claim 17, in which the r.f. pulses impart a total flip angle of less than 2°.

19. An apparatus comprising:

a medical implement including three positioning elements, each positioning element including an MR active sample and an r.f. receiver coil carried by the sample for receiving a magnetic resonance signal therefrom;

magnetic resonance processing electronics including a plurality of receiver channels, the receiver coils being connected to a separate receiver channels and r.f. excitation pulse and magnetic field gradient means for exciting and detecting magnetic resonance;

wherein the three positioning elements are so located in relation to the medical implement and to one another that when energised they generate signals which enable the position and orientation of the implement to be determined and/or visualised with respect to x, y and z axes.

* * * * *